US010096612B2

(12) United States Patent
Vegunta et al.

(10) Patent No.: US 10,096,612 B2
(45) Date of Patent: Oct. 9, 2018

(54) THREE DIMENSIONAL MEMORY DEVICE HAVING ISOLATED PERIPHERY CONTACTS THROUGH AN ACTIVE LAYER EXHUME PROCESS

(71) Applicant: INTEL CORPORATION, Santa Clara, CA (US)

(72) Inventors: Sri Sai Sivakumar Vegunta, Boise, ID (US); Gowrisankar Damarla, Boise, ID (US); Jian Zhou, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/853,783

(22) Filed: Sep. 14, 2015

(65) Prior Publication Data

US 2017/0077117 A1    Mar. 16, 2017

(51) Int. Cl.
| | |
|---|---|
| *G06F 12/00* | (2006.01) |
| *H01L 27/11582* | (2017.01) |
| *H01L 27/11573* | (2017.01) |
| *H01L 21/3213* | (2006.01) |
| *H01L 21/311* | (2006.01) |
| *H01L 21/768* | (2006.01) |
| *G06F 3/06* | (2006.01) |
| *H01L 27/1157* | (2017.01) |

(52) U.S. Cl.
CPC ...... *H01L 27/11582* (2013.01); *G06F 3/0604* (2013.01); *G06F 3/0659* (2013.01); *G06F 3/0679* (2013.01); *G06F 12/00* (2013.01); *H01L 21/31111* (2013.01); *H01L 21/32133* (2013.01); *H01L 21/7682* (2013.01); *H01L 21/76802* (2013.01); *H01L 21/76837* (2013.01); *H01L 27/1157* (2013.01); *H01L 27/11573* (2013.01)

(58) Field of Classification Search
CPC ...................................................... G06F 12/00
USPC ........................................................ 711/103
See application file for complete search history.

(56) References Cited

U.S. PATENT DOCUMENTS

| | | | | |
|---|---|---|---|---|
| 2011/0284992 | A1* | 11/2011 | Zhu | H01L 21/76898 257/611 |
| 2011/0316069 | A1 | 12/2011 | Tanaka et al. | |
| 2012/0193785 | A1* | 8/2012 | Lin | H01L 21/76229 257/737 |
| 2013/0258792 | A1* | 10/2013 | Kitano | H01L 23/5223 365/189.17 |
| 2014/0054673 | A1 | 2/2014 | Kim et al. | |
| 2014/0061748 | A1 | 3/2014 | Lee | |
| 2014/0346428 | A1* | 11/2014 | Sills | H01L 27/2481 257/4 |

(Continued)

OTHER PUBLICATIONS

PCT "Notification of Transmittal of the International Search Report and the Written Opinion of the International Searching Authority, or the Declaration", Application No. PCT/US2016/044074, dated Oct. 20, 2016, 9 pages.

*Primary Examiner* — Gautam Sain
(74) *Attorney, Agent, or Firm* — Compass IP Law PC

(57) ABSTRACT

A three dimensional memory device is described having an array region and a periphery region. The array region has a three dimensional stack of storage cells. The periphery region has contacts that extend from above the three dimensional stack of storage cells to below the three dimensional stack of storage cells. The periphery region is substantially devoid of conducting and/or semi-conducting layers of the three dimensional stack of storage cells.

20 Claims, 20 Drawing Sheets

(56) References Cited

U.S. PATENT DOCUMENTS

| | | |
|---|---|---|
| 2015/0076585 A1 | 3/2015 | Pachamuthu et al. |
| 2015/0129978 A1* | 5/2015 | Moon ............... H01L 21/76898 257/394 |
| 2015/0179662 A1 | 6/2015 | Makala et al. |
| 2015/0187680 A1* | 7/2015 | Seo ....................... H01L 23/481 324/762.01 |
| 2015/0249096 A1* | 9/2015 | Lupino ............. H01L 27/11898 257/203 |
| 2016/0011779 A1* | 1/2016 | Lee ........................ G06F 3/061 711/103 |

\* cited by examiner

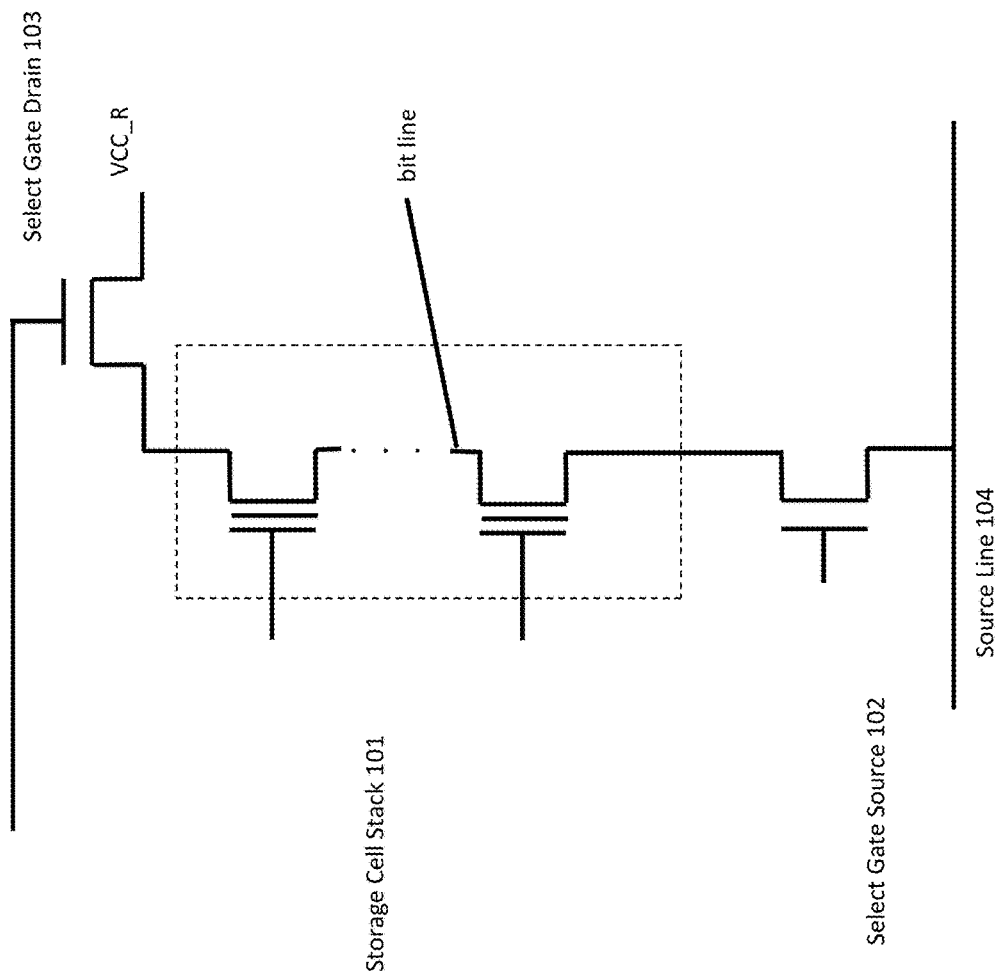

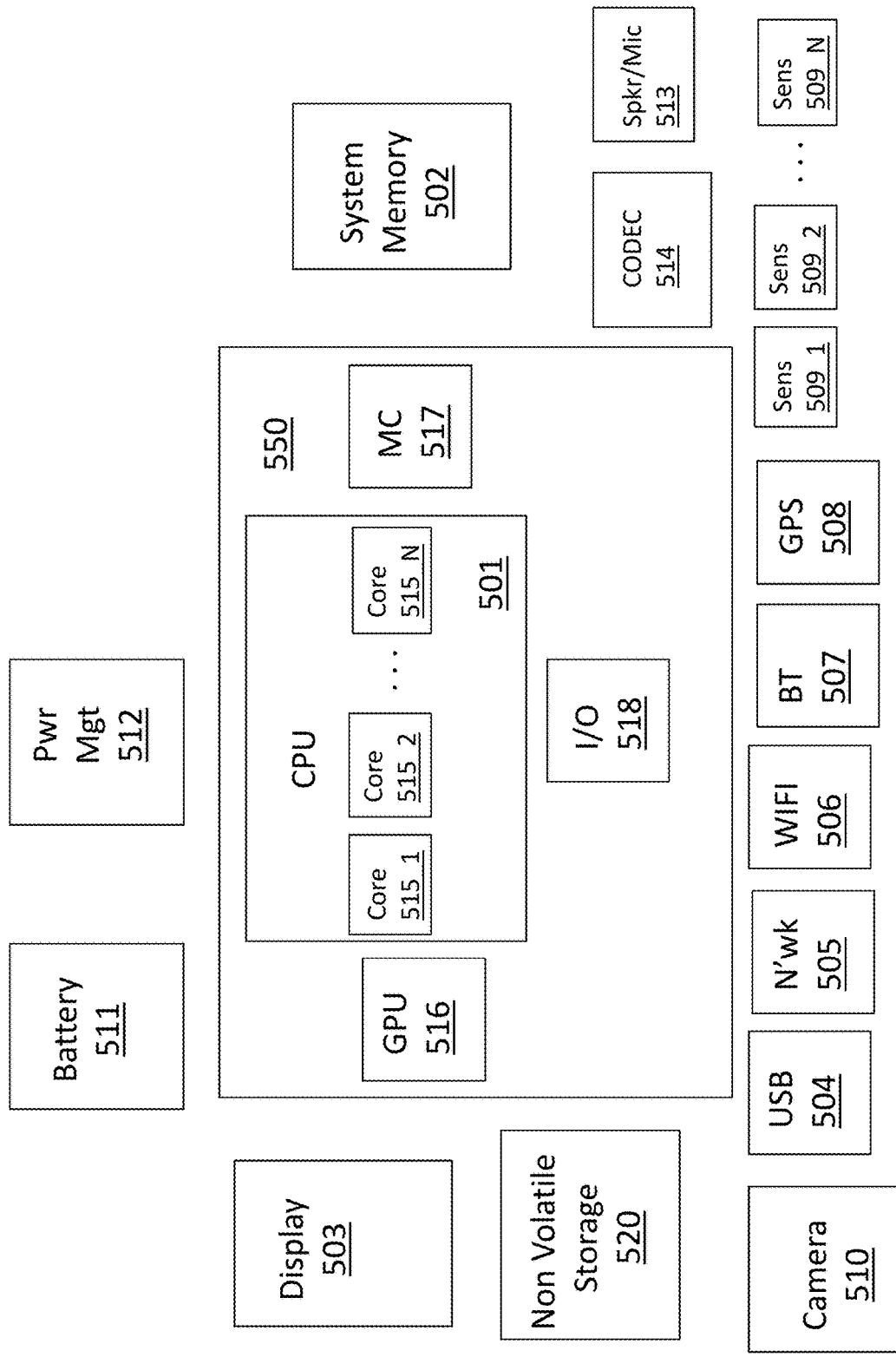

US 10,096,612 B2

THREE DIMENSIONAL MEMORY DEVICE HAVING ISOLATED PERIPHERY CONTACTS THROUGH AN ACTIVE LAYER EXHUME PROCESS

FIELD OF INVENTION

The field of invention pertains generally to the semiconductor arts, and, more specifically, to a three dimensional memory device having isolated periphery contacts through an active layer exhume process.

BACKGROUND

The emergence of mobile devices has created keen interest amongst non volatile semiconductor memory manufacturers to increase the densities of their devices. Generally, mobile devices do not make use of disk drives in favor of semiconductor based non volatile storage devices. Historically, however, semiconductor storage devices do not have the same storage density as disk drives.

In order to bring the storage densities of semiconductor memories closer to or beyond disk drives, non volatile memory device manufacturers are developing three dimensional memory technologies. In the case of three dimensional memory technologies, individual storage cells are vertically stacked on top of another within the storage device. Three dimensional memory devices may therefore provide a mobile device with disk drive like storage density in a much smaller package, cost and power consumption envelope. However, the manufacture of three dimensional memory devices raises new manufacturing technology challenges.

FIGURES

A better understanding of the present invention can be obtained from the following detailed description in conjunction with the following drawings, in which:

FIG. 1 shows a three dimensional memory circuit;

FIG. 5 shows an embodiment of a computing system.

DETAILED DESCRIPTION

Figure 2A:
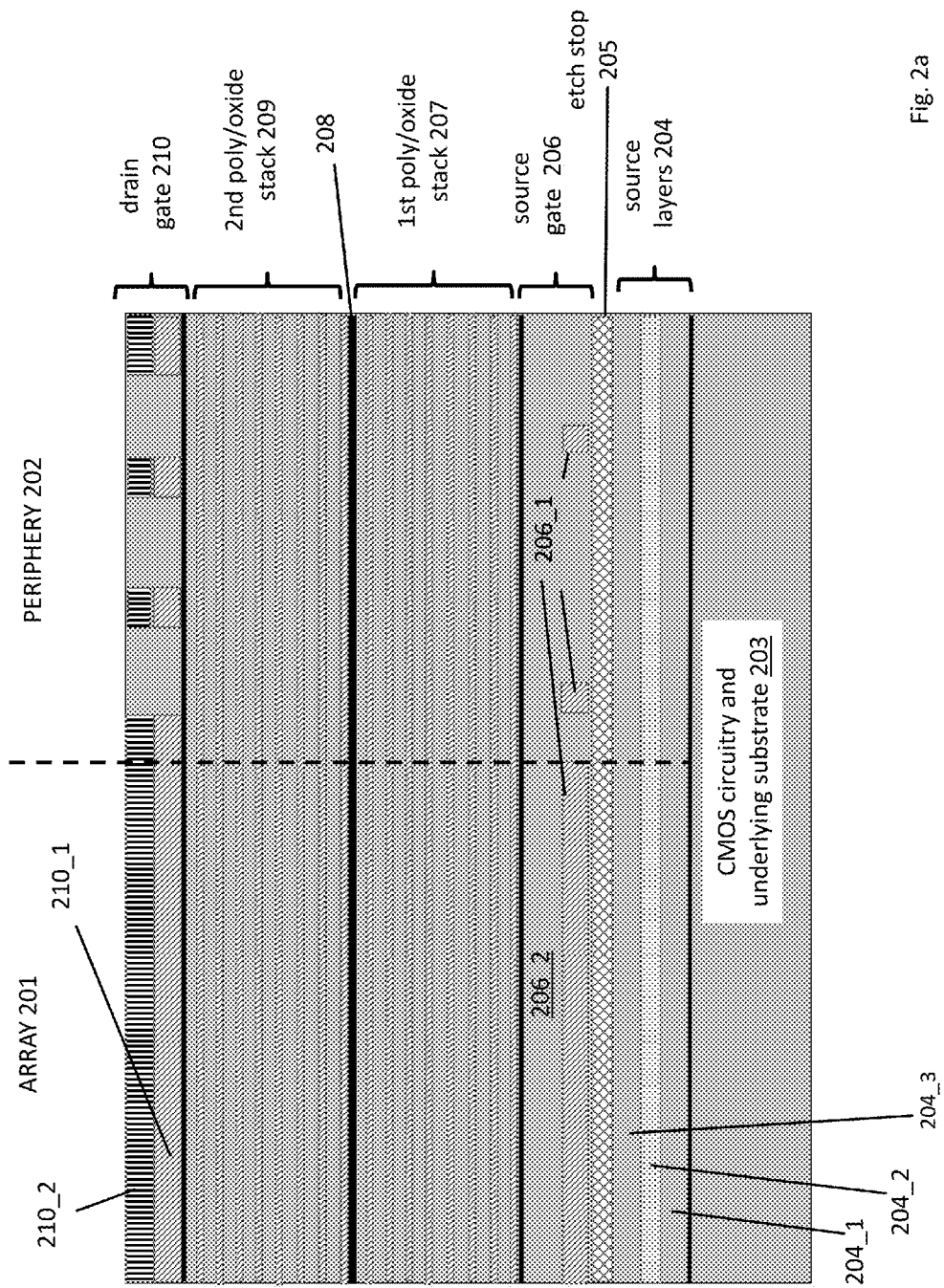
FIGS. 2a through 2j show a first embodiment for manufacturing a three dimensional memory circuit.

FIG. 1 shows a circuit schematic for the storage cell region of a three dimensional NAND FLASH memory. As observed in FIG. 1, the circuit includes a stack of NAND FLASH storage cells 101 coupled between a select gate source transistor 102 and a select gate drain transistor 103. The select gate source transistor 102 is coupled to a source line 104. The stack of storage cells 101 may be implemented as a three dimensional stack of FLASH transistors that are monolithically integrated as a three dimensional storage array on a semiconductor chip along with the select gate source and select gate drain transistors 102, 103 as well as other transistor devices (not shown) that help implement, e.g., the NAND function of the storage cell, sense amplifiers, row decoders, address decoders, etc.

In various embodiments, the storage cell stack 101 may be physically sandwiched between the select gate source transistor 102 (which, e.g., may reside beneath the storage cell stack) and the select gate drain transistor 103 (which, e.g., may reside above the storage cell). As the storage cell stack grows in height to accommodate more layers of storage cells so as to increase the density of the memory device, it becomes more difficult to form the electrical contacts/interconnections between the lower circuit structures (e.g., the select gate source transistor 102, logic transistors or the decoders) and various back-end-of-line (BEOL) input and/or output (I/O) structures (e.g., power inputs, read/write inputs, erase inputs). Here, the sheer height of the storage cell stack 101 requires lengthy (e.g., >5 μm) contact structures from the BEOL I/O structures to levels at or beneath the select gate source transistor 102.

FIGS. 2a through 2j depict a first methodology for manufacturing a three dimensional NAND FLASH memory device. Various embodiments may alleviate issues associated with lengthy contact structures.

A partially completed device is first observed in FIG. 2a. As observed in FIG. 2a, lower level transistors 203 used to implement, e.g., sense amplifiers, address decoders, row decoders, etc., are disposed on a semiconductor substrate beneath the storage cell region of the device. Above the lower transistors 203 a plurality of source layers 204 are formed. Source layers 204 are used to form the source lines 104 of the memory device. In an embodiment, the source layers include a dielectric layer 204_1 (e.g., an oxide layer), one or more conductive layers 204_2 and another, upper dielectric layer 204_3.

The lower dielectric layer 204_1 helps insulate the lower transistors 203 from the upper storage cell tiers 207, 209. The conductive layering 204_2 form the actual source line wiring. In an embodiment, the conductive layering 204_2 is a multi-layer structure composed of a lower layer of metal (e.g., Tungsten Silicide (WSix)) and an upper layer of poly silicon. The upper dielectric layer 204_3 insulates the source lines 204_2 from an etch stop layer 205. The etch stop layer may be composed, for example, of any of metal, metal oxide (e.g., aluminum oxide). The purpose of the etch stop layer 205 will be explained more fully below.

The select gate source transistor structures 206 are formed over the etch stop layer 205. In an embodiment, the select gate source transistor structures include a poly silicon layer 206_1 beneath a dielectric (e.g., oxide) layer 206_2. For simplicity, FIG. 2a shows the poly silicon layer 206_1 only being patterned in a "periphery" region 202.

A first tier 207 of stacked storage devices (e.g., FLASH transistor cells) is formed above dielectric layer 206_2. The stacked storage devices are constructed, in an embodiment, from alternating poly-silicon and oxide layers. In various embodiments, there may be, e.g., more than twenty layers of storage devices in a single tier. Another dielectric (e.g., nitride) layer 208 resides between the first tier 207 of stacked storage devices and a second tier 209 of stacked storage devices to effectively act as a hard mask for lower array cell formation and contact/plug formation from the top array deck to the lower array deck.

The select gate drain transistor device structures 210 are formed above the second stacked storage tier 209. In an embodiment, the select gate drain transistor device structures 210 are formed from a first, lower layer of poly-silicon 210_1 and an upper dielectric layer 210_2 (e.g., composed of nitride). Again, for illustrative ease, the poly-silicon select gate transistor layer 210_1 is depicted as being patterned only within the periphery region 202.

The array region 201 area of the substrate includes the actual storage devices themselves while the periphery region 202 is a reserved area where lengthy contact structures are formed to connect the BEOL I/O contract structures (not shown) to the lower select gate source transistor structures 206, the even lower source line structures 204, or even the lower transistors 203.

A potential problem in forming these contacts is the existence of conductive poly silicon layers of the stacked tier regions 207, 209 within the periphery 202. Prior attempts at constructing lengthy contacts through the periphery required very wide as well as very deep vias so that a suitable thickness of dielectric could be formed around the contacts to insulate them from the conductive poly silicon layer. Fabricating insulation around the contacts with suitable thickness and/or uniformity completely around the contacts along their entire extensive length is not shown to be easily repeatable or reliable. Another approach is to completely etch away the entirety of the periphery region which results in the formation of large via openings in the wafer surface. The large periphery openings are then filled with dielectric material that ultimately covers the entirely of the wafer surface. The covering of the wafer surface with dielectric requires additional processing procedures to remove the dielectric from the wafer surface (while leaving the periphery openings filled with the dielectric) to prepare the wafer surface for subsequent BEOL processing.

The manufacturing approach described immediately below at least aims to form contacts in the periphery 202 with suitable isolation around them and the poly silicon layers of the stacked tier regions while avoiding or reducing the problems and/or processing inefficiencies described just above.

Figure 2B:
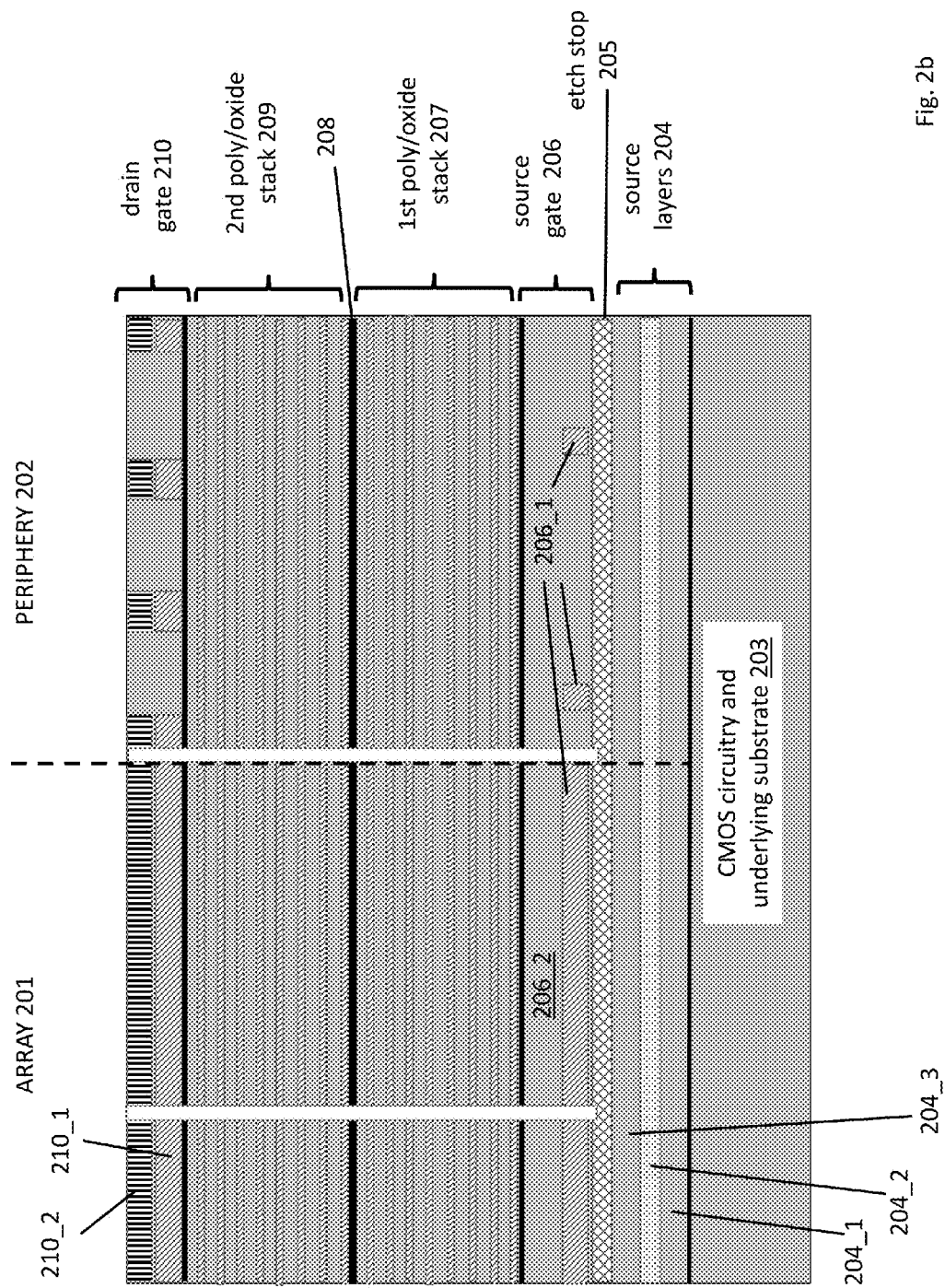
Figure 2C:
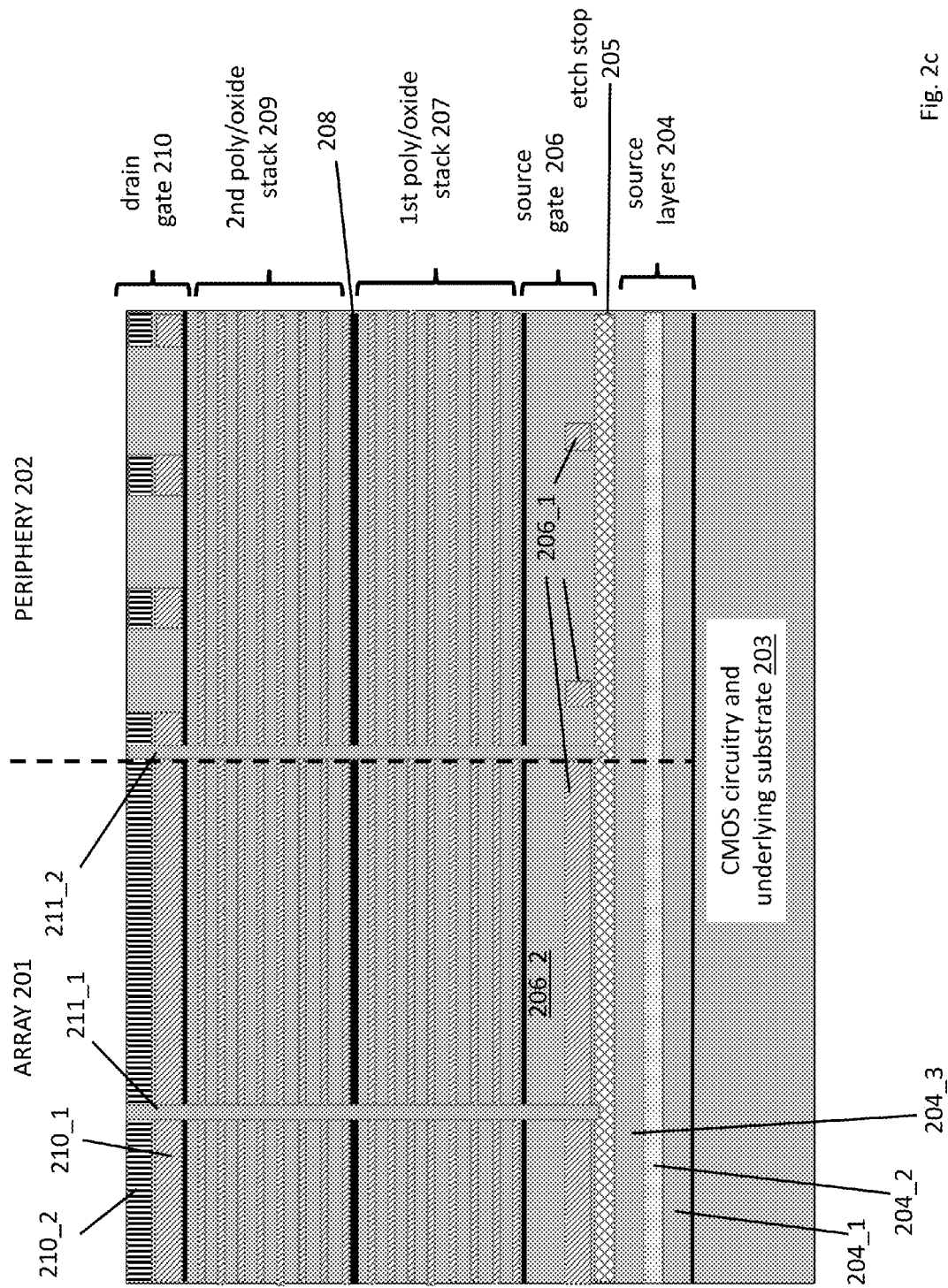

Referring to FIG. 2b, the overall structure is coated with photoresist and patterned to expose openings at regions on the structure surface. The exposed openings are etched to form open vias that stop at etch stop layer 205. In an embodiment, the etch is performed with a non selective etch that stops when reaching a metal or metal oxide. As observed in FIG. 2c, the open vias are filled with a dielectric (e.g., oxide) to form an array slit 211_1 within the array region 201 and a periphery moat 211_2 along the border between the array region 201 and the periphery region 202. The array slit 211_1 parses both the storage tiers 207, 209 into smaller groups of storage cells according to the architecture of the memory device (e.g., block size dimensions are determined). The periphery moat 211_2 isolates the storage tiers 207, 209 from the periphery region 202.

Figure 2D:
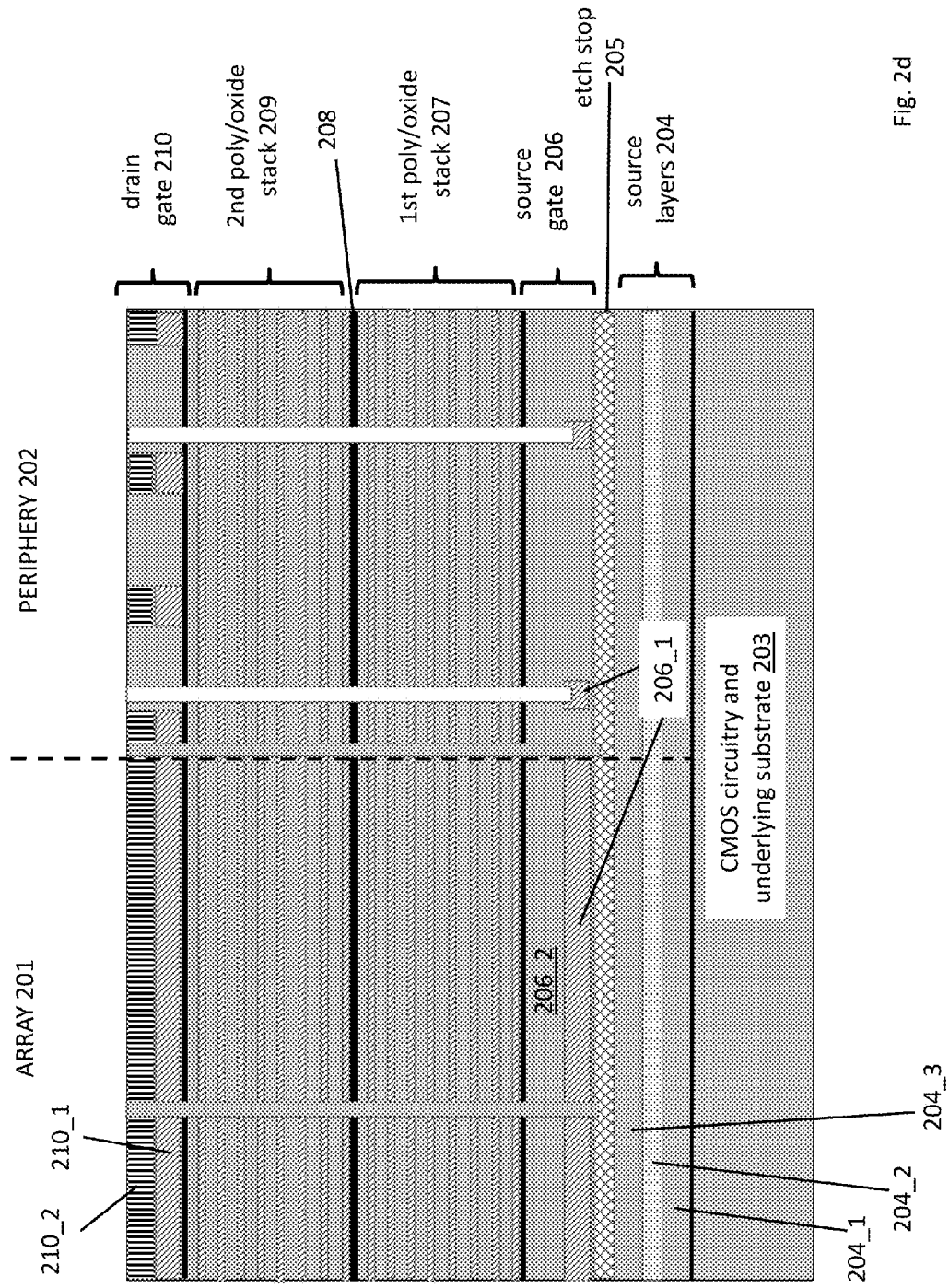
Figure 2E:
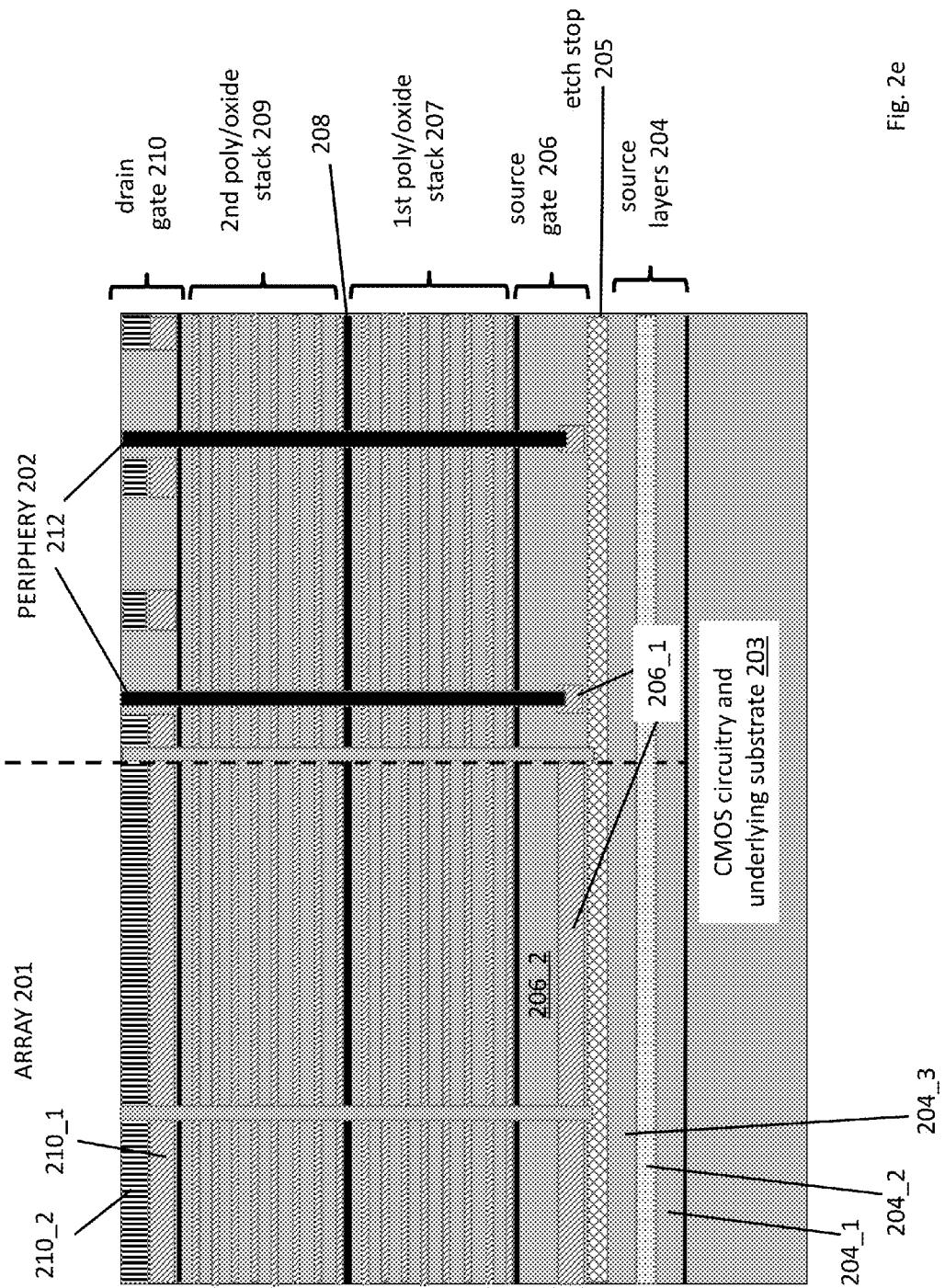

Referring to FIG. 2d, the overall structure is again coated with photoresist and patterned to expose openings at regions on the structure surface within the periphery region 202. The exposed openings are also etched to form open vias that stop at the poly silicon of the gate source layer. Referring to FIG. 2e, the vias are then filled with metal to form contacts 212 to the select gate source transistor layer 206. In an embodiment, although not shown in the figures, the open vias are first filled with oxide or other dielectric material which is again subsequently etched through the bottom to form a dielectric spacer layer for the subsequent contact metal fill.

Figure 2F:
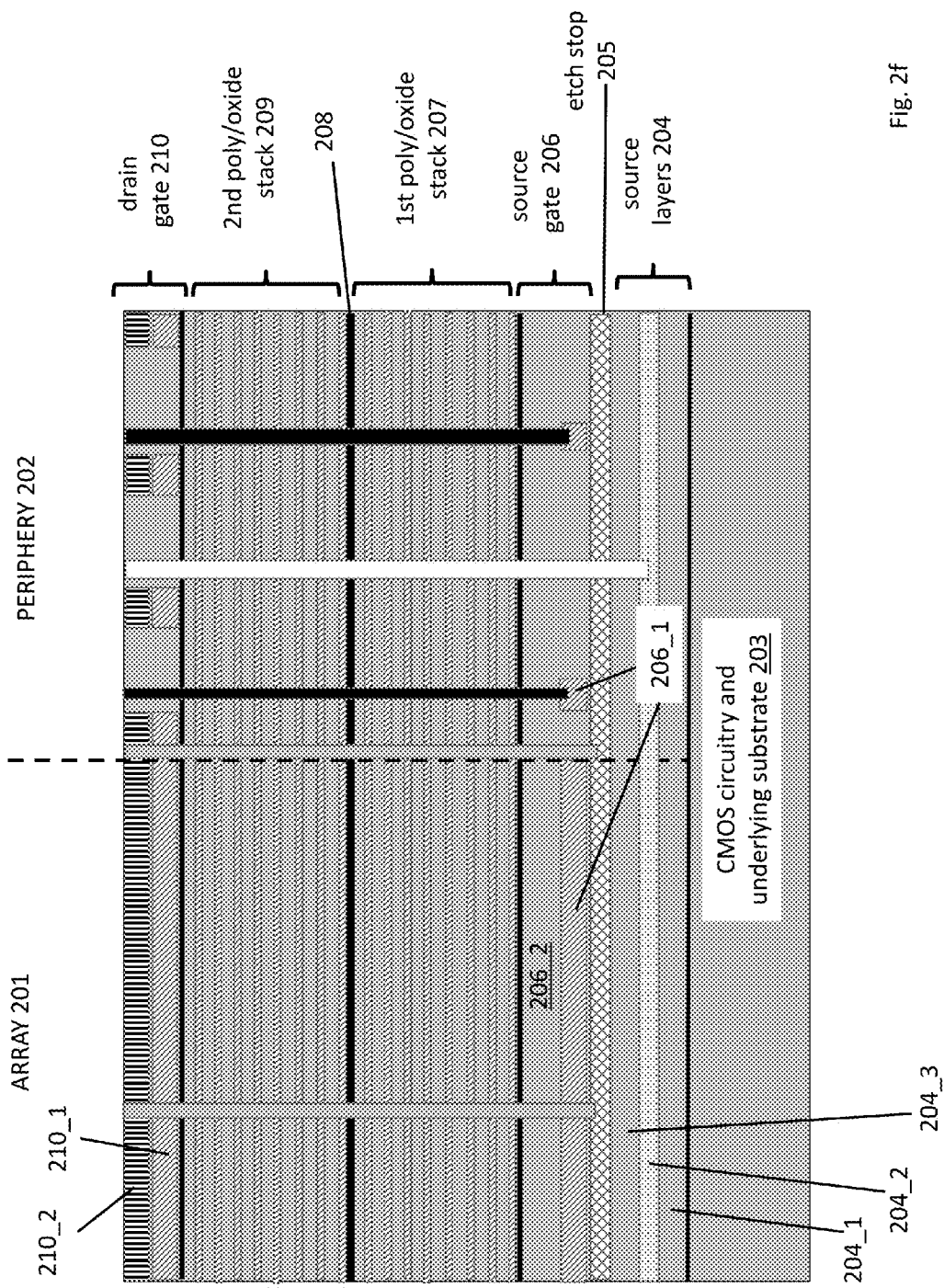

Referring to FIG. 2f, the overall structure is again coated with photoresist and patterned to expose another opening at a region on the structure surface within the periphery region 202. The exposed opening is also etched to form an open via that stops at the source line wiring layer 204_2. Notably, the etch used to form the open via of FIG. 2f punches through the etch stop layer 205 in order to reach the source line wiring layer 204_2. In an embodiment, a non selective etch that stops at metal is used (because the source line wiring is composed of metal).

Figure 2G:
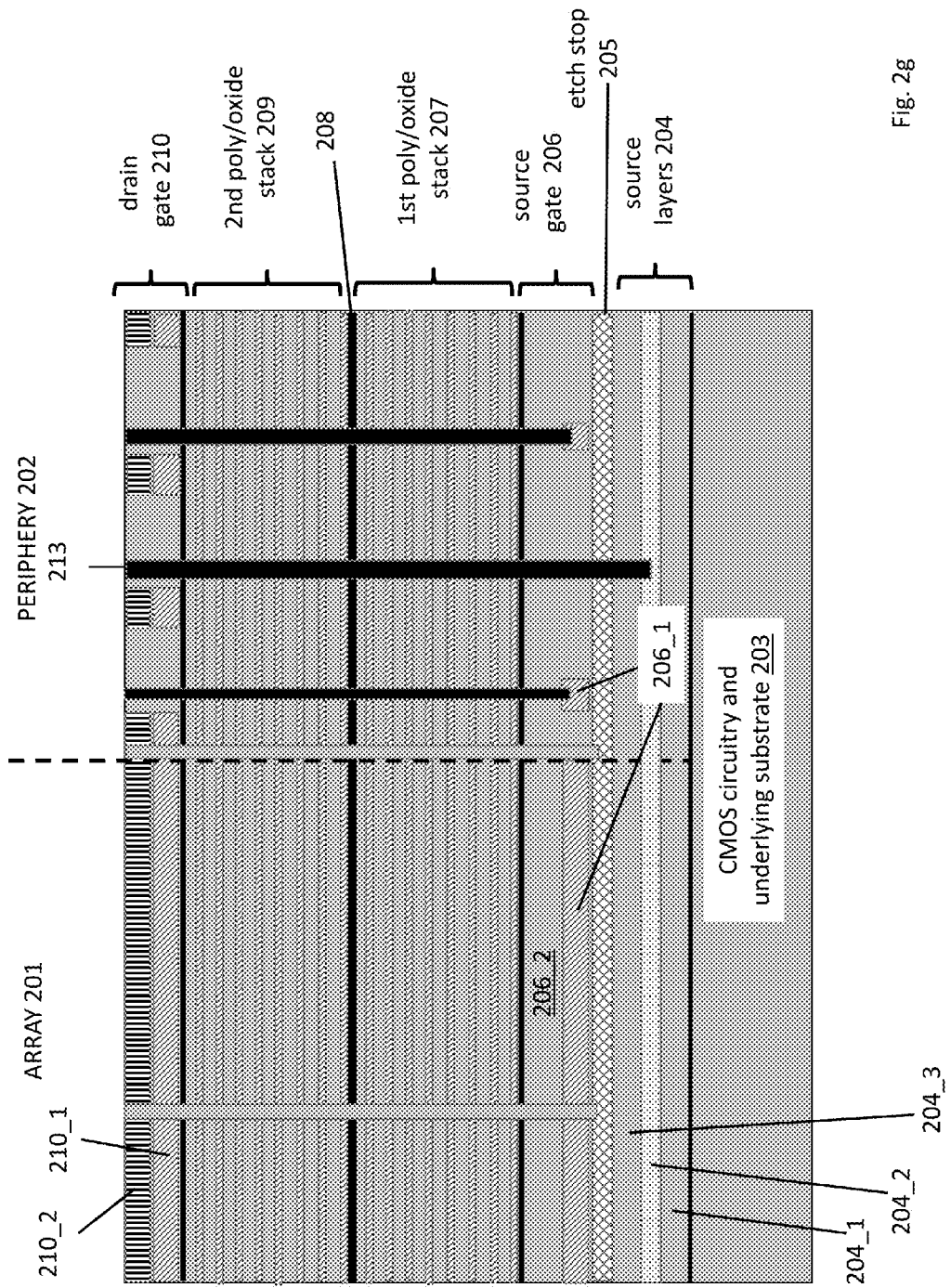

Referring to FIG. 2g, the via created in FIG. 2f is filled with metal to form a contact 213 to the source line wiring layer 204_2. Again, a spacer layer may be formed between the contact and its surroundings as discussed above with respect to contacts 212.

In an alternate embodiment, the etches of FIGS. 2d and 2f are performed simultaneously with a non-selective etch that stops when poly-silicon or metal is reached (as such, the etch will stop when the poly source gate layer 206 is reached and when the metal of source layer 204 is reached. The total etch time for the different depth etches can also be made substantially the same through critical dimension control. Here, recall that the surface of the structure is covered with photoresist and patterned to form openings in the surface where the etches are desired. By adjusting the size of the openings the depth of the etch for a specific amount of time can be established. For example, smaller openings may result in a shallower etch depth than larger openings. As such, openings for etches that are supposed to stop at the gate source layer 206 may be made smaller than openings for etches that are supposed to stop at the source layer 204. If the etches of FIGS. 2d and 2f are performed simultaneously, then likewise, the metal fill of FIGS. 2e and 2g may also be performed simultaneously.

Irrespective if the etches of FIGS. 2d and 2f are performed simultaneously or separately and/or the metal fills of FIGS. 2e and 2g are performed simultaneously or separately, note that an entire other sequence of etching and metal filling may take place that attempt to form contacts to the underlying circuitry layer 203. The etch and metal fill for contacts that reach layer 203 may be performed separately from or simultaneously with the etches of FIGS. 2d and 2f and the fills of FIGS. 2e and 2g consistent with the teachings provided above. For instance, in the case of simultaneous etching, the patterned openings for the etches that reach layer 203 may be made even larger than the openings used for etches that are supposed to reach source layer 204.

Figure 2H:
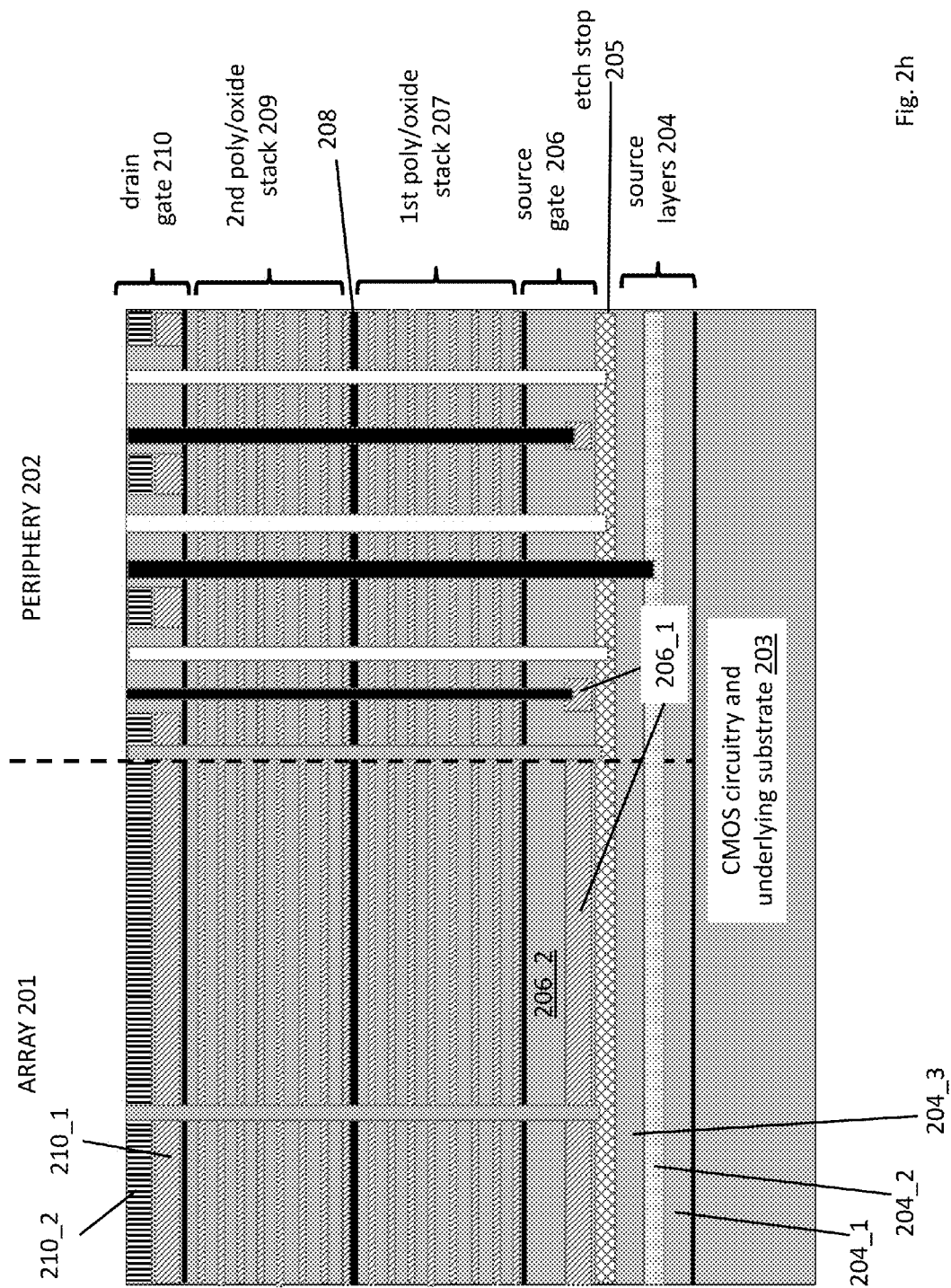

Referring to FIG. 2h, the overall structure is again coated with photoresist and patterned to expose openings at regions on the structure surface within the periphery region 202. The exposed openings are etched to form open vias that stop at etch stop layer 205. In an embodiment, a non selective etch that stops when reaching metal or metal oxide is used to stop the etch at the etch stop layer 205 (which may be composed, e.g., of a metal or metal oxide). In a further embodiment, the etch is the same etch as performed in FIG. 2b.

Figure 2I:
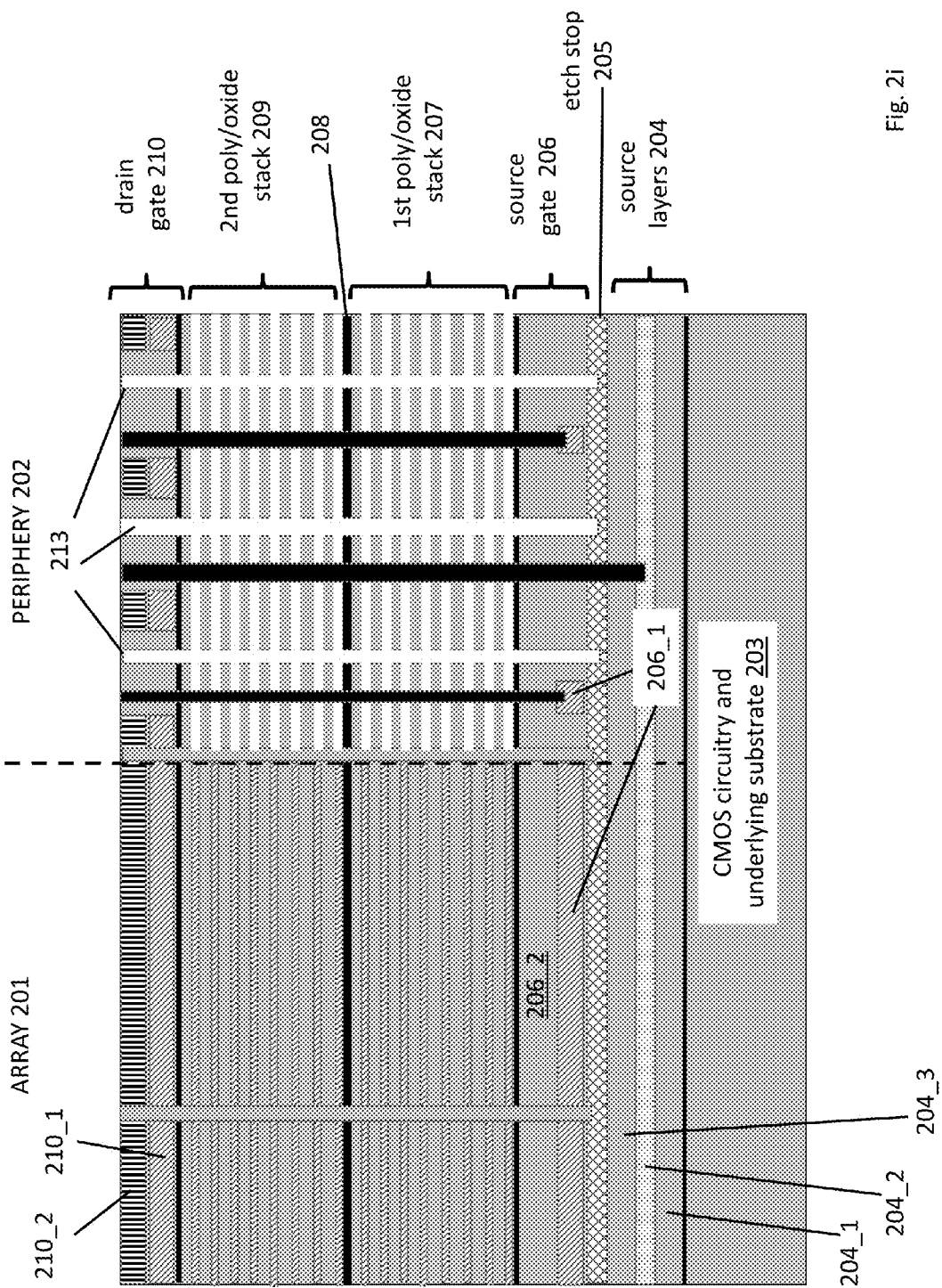

As observed in FIG. 2i, rather than fill the vias formed in FIG. 2h, the open vias are left open 213 in order to expose to the ambient the poly-silicon layers of both stacked tier regions 207, 209 within the periphery region 202. The exposed poly-silicon layers are then exhumed or otherwise removed from the periphery region by, e.g., an ambient chemical reaction etching process that chemically removes poly silicon but not the surrounding dielectric or contact metal. An example includes hot Tetra-Methyl Ammonium Hydroxide (TMAH).

Figure 2J:
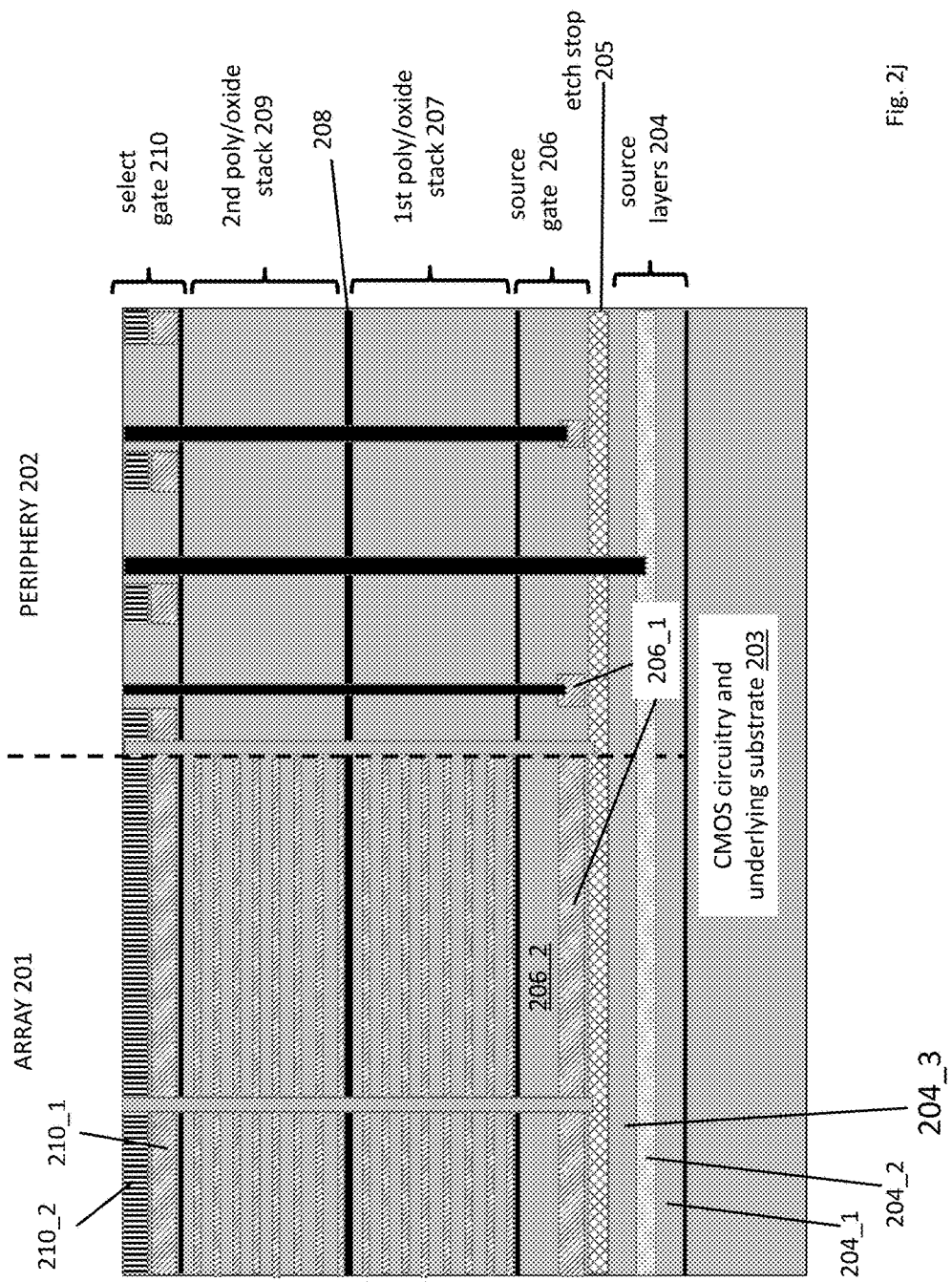

After the poly-silicon storage tier layers are removed from the periphery region 202, the surrounding dielectric within the periphery 202 is grown and/or the exposed openings are conformally filled with more dielectric to form the completed structure as observed in FIG. 2j. Here, a conformal dielectric "fill" process (i.e., a process that conforms to the topography of the structure it is supposed to cover) may be used such as applying a liquid form of dielectric to the substrate and then spinning the liquid oxide to fill the crevices that result from the removed poly-silicon. Notably, however, uniformity of the dielectric within the periphery 202 is not a critical parameter because the poly silicon has been removed. Here, the existence of air gaps within the insulation of the periphery 202 may actually improve the degree of insulation.

After the structure of FIG. 2*j* is formed, BEOL processing may commence to complete the fabrication of the device. The BEOL processing may include, e.g., the forming of I/O structures on the wafer surface that are electrically coupled to contacts 212, 213.

Note that the methodology of FIGS. 2*a* through 2*j* began with a structure that had completed the layers for all the devices before beginning to form the periphery contacts. That is, as of FIG. 2*a*, the select gate drain transistor device layers 210 have already been formed. By contrast, FIGS. 3*a* through 3*i* show another embodiment in which the processing of the periphery contacts begins prior to the completed formation of the select gate drain transistor devices.

Figure 3A:
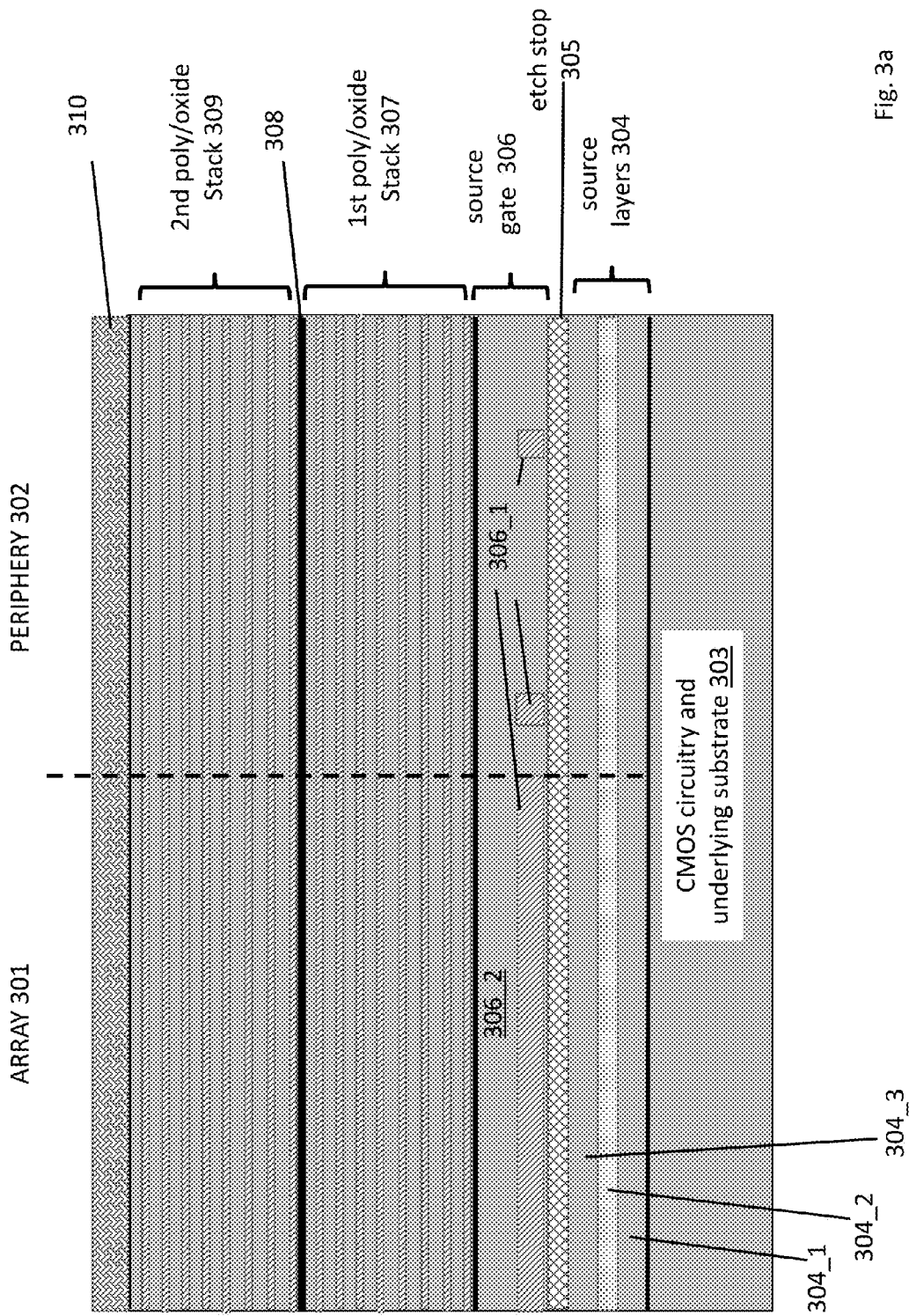
FIGS. 3a through 3g show a second embodiment for manufacturing a three dimensional memory circuit.

FIG. 3*a* shows the completed structure up through the second storage tier 309. Rather than a select gate drain transistor device layer residing above the second storage tier 309, however, a (e.g., nitride) sacrificial layer 310 is formed. In various embodiments, the nitride layer 310 is used as a hard mask for the formation of the upper deck storage cells and is sacrificial once the storage cells are completed.

Figure 3B:
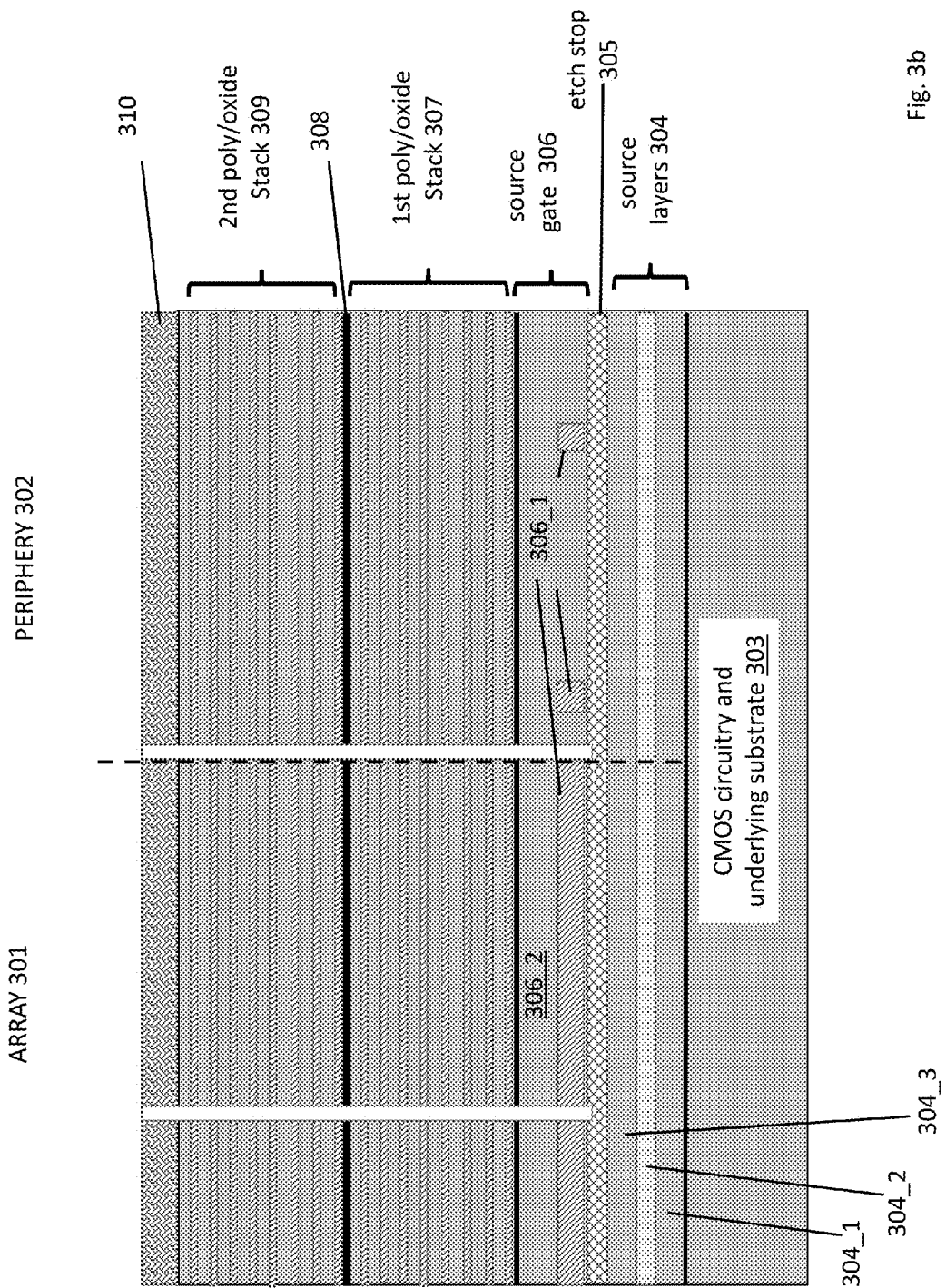
Figure 3C:
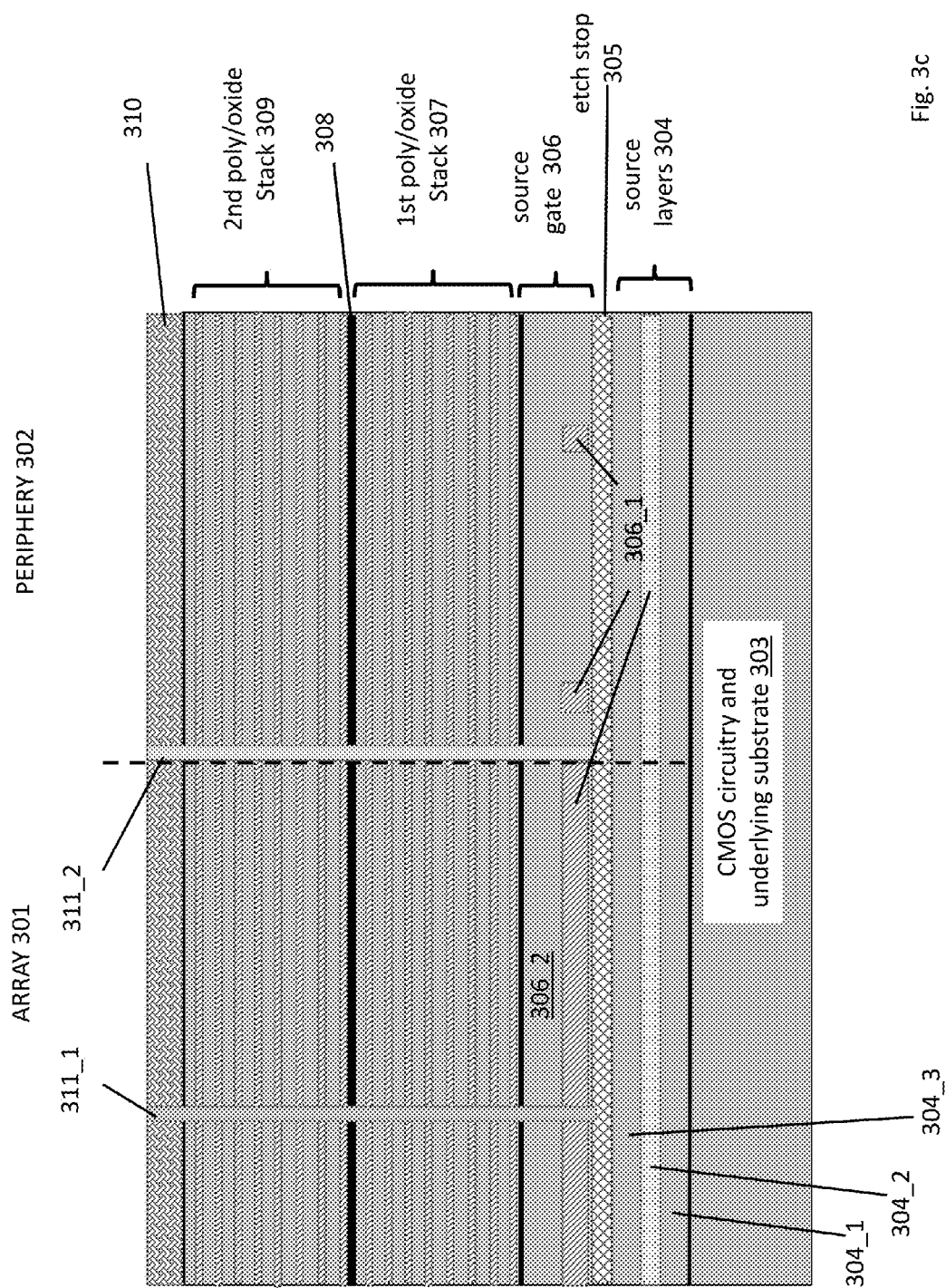

Referring to FIG. 3*b*, the overall structure is coated with photoresist and patterned to expose openings at regions on the structure surface. The exposed openings are etched to form open vias that stop at etch stop layer 305. As observed in FIG. 3*c*, the open vias are filled with a dielectric (e.g., oxide) to form an array slit 311_1 within the array region 301 and a periphery moat 311_2 along the border between the array region 301 and the periphery region 302.

Figure 3D:
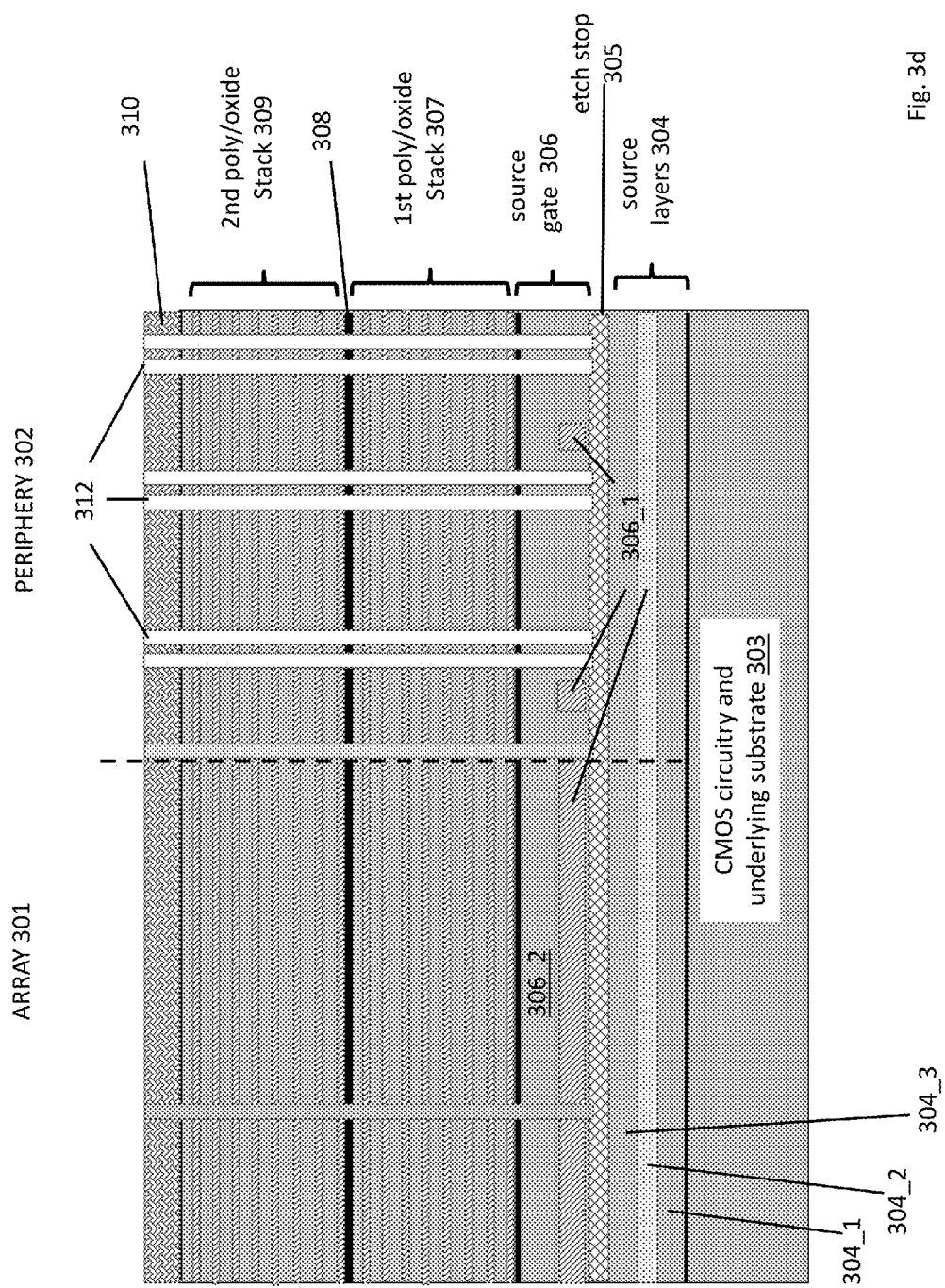

As observed in FIG. 3*d*, the overall structure is coated with photoresist and patterned to expose openings at regions on the structure surface within the periphery region 302. The exposed openings are etched to form open vias that stop at etch stop layer 305. Here, pairs of open vias are formed to better expose the poly-silicon regions within the periphery 302. That is, because no contacts have yet been formed in the periphery region 302, there exists more poly silicon to remove in the periphery region 302 of FIG. 3*d* than exists in the periphery region 202 of FIG. 2*h*. Thus, in order to expose the greater amount of poly silicon, more vias are etched in the approach of FIG. 3*d*.

Figure 3E:
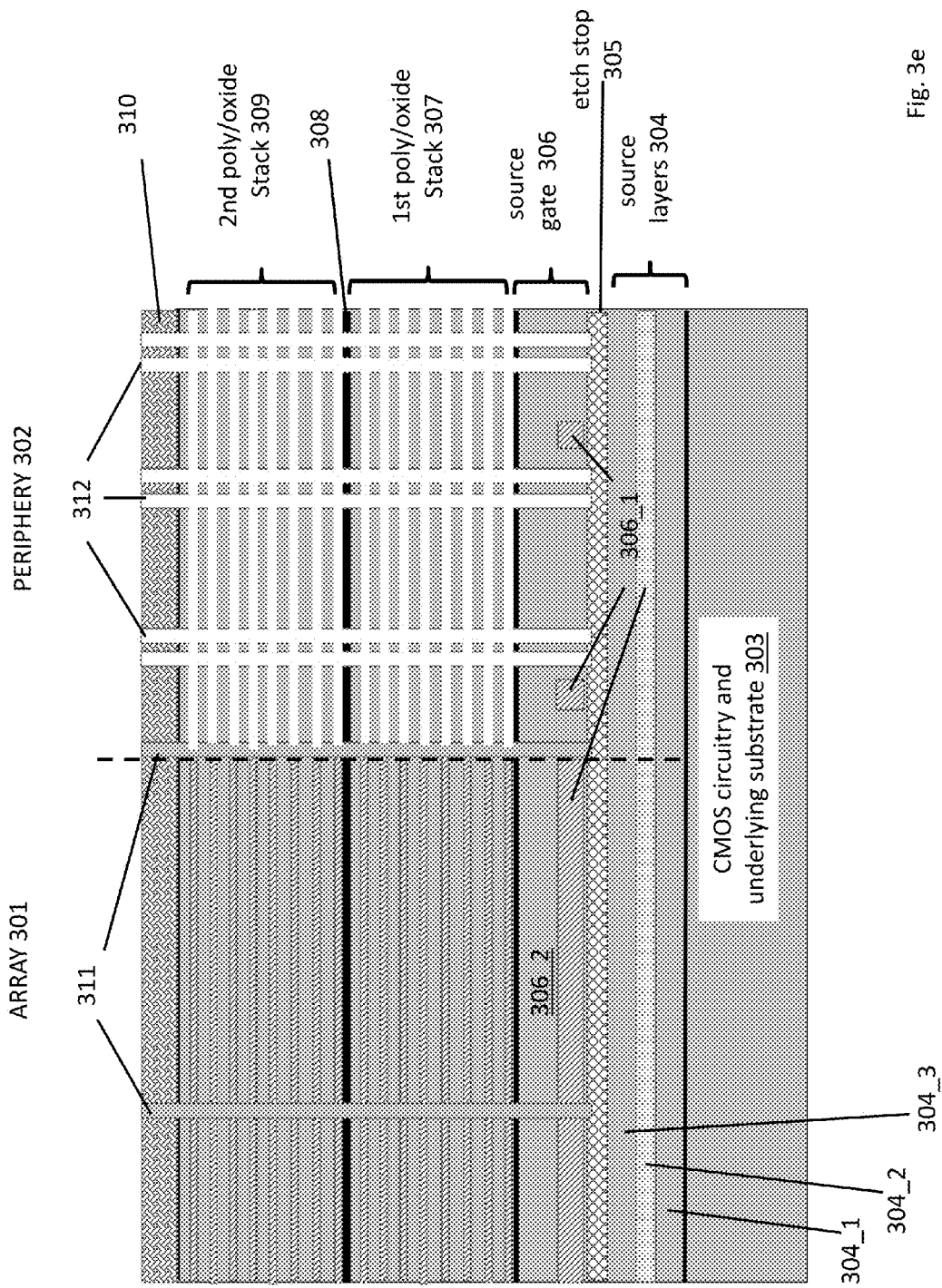
Figure 3F:
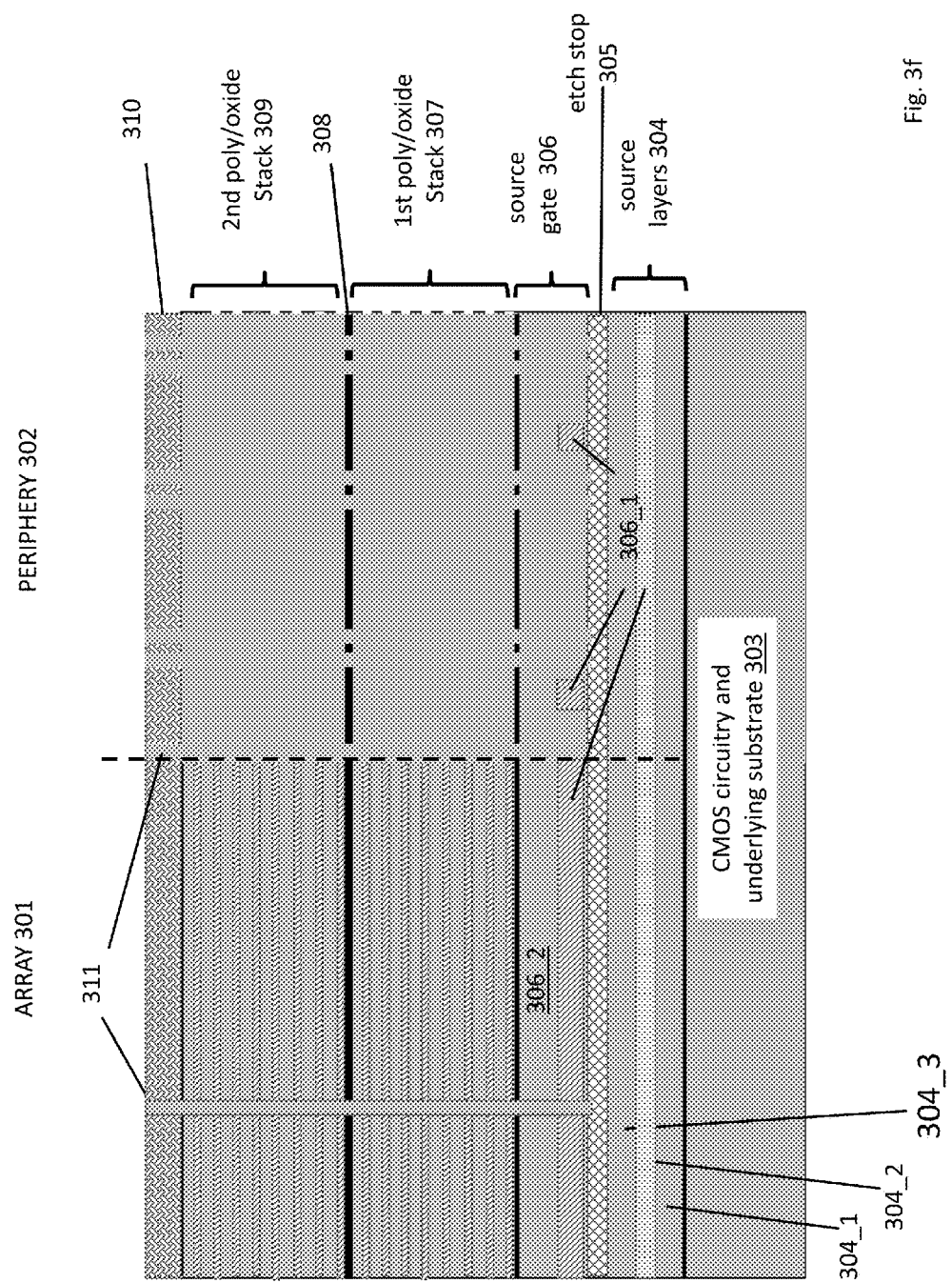

As observed in FIG. 3*e*, the poly silicon regions within the periphery region 302 are exhumed. As observed in FIG. 3*f*, the open voids formed by the removed poly-silicon are filed with dielectric by, e.g., growing and/or filling the surrounding oxide, e.g., with a conformal fill process as described above.

Figure 3G:
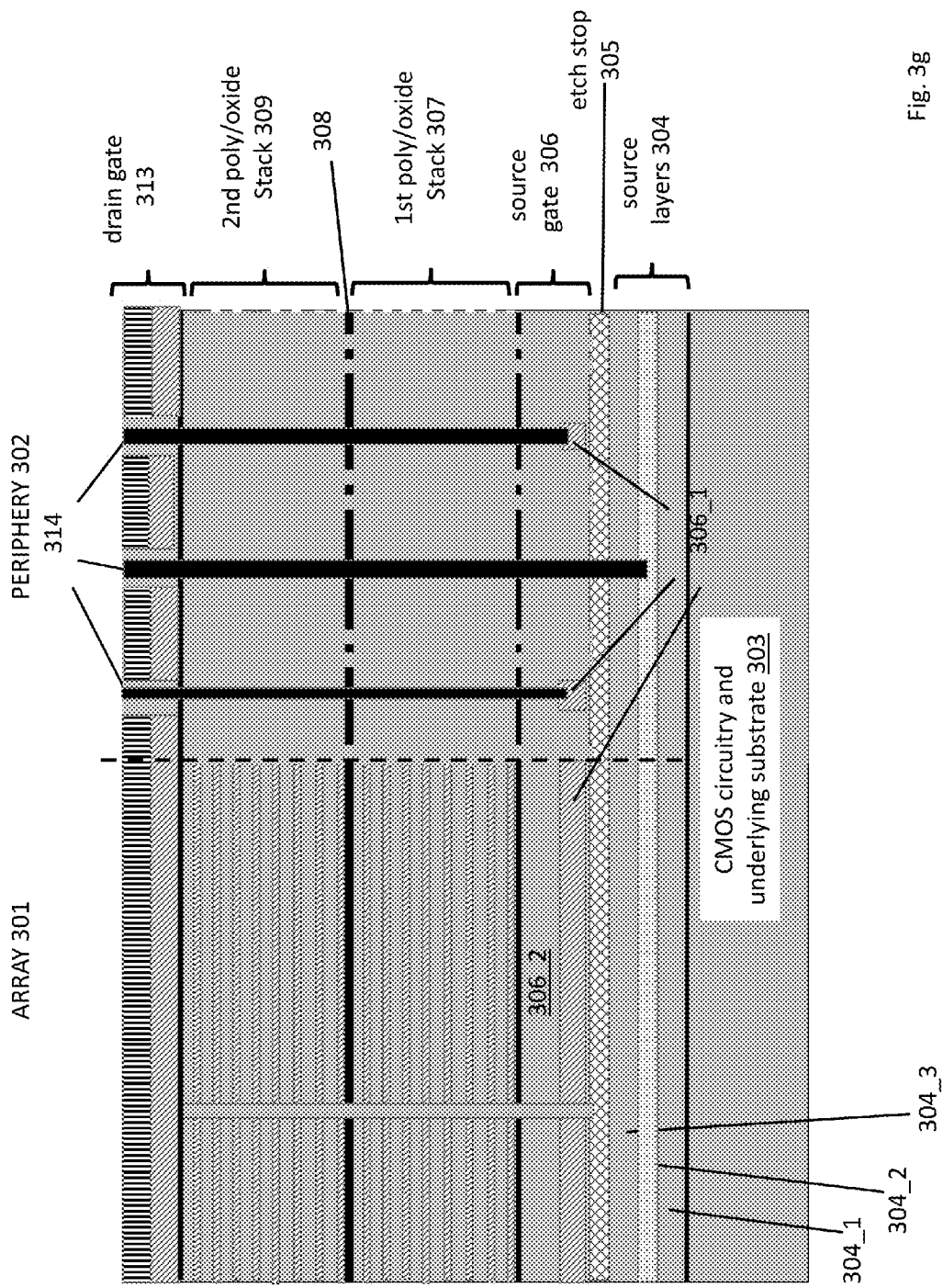

A observed in FIG. 3*g*, the metal contacts within the periphery 302 are formed and the select gate drain transistor device layers 310 are formed over the structure to form a completed structure. Spacers may be formed around the contacts as described above. In order to form the metal contacts within the periphery, the etches to source gate 306 and source layer 304 may be performed separately or simultaneously. Likewise, the metal fill of the openings formed by the etches may be performed separately or simultaneously. In embodiments where the etches are formed simultaneously, critical dimension control may be used to simultaneously create etches of different etch depths (e.g., shallower etches are effected with smaller openings and deeper etches are effected with larger openings). Etches and contacts to the lower circuitry layer 203 may also be formed (again simultaneously with or separately from the other etches and fills). After the structure of FIG. 3*g* is formed, BEOL processing may commence to form I/O structures that are electrically coupled to contacts 314.

Although the above description has been directed to a NAND FLASH memory storage cell technology, it is conceivable that other memory storage cell technologies whose active layers are composed of poly silicon or any other conductive and/or semi-conductive material that can be removed by a chemical exhume process can be candidates to make use of the teachings of the instant description. Such possible storage cell technologies may include but are not limited to phase change based storage cells, ferro-electric based storage cells (e.g., FRAM), magnetic based storage cells (e.g., MRAM), spin transfer torque based storage cells (e.g., STT-RAM), resistor based storage cells (e.g., ReRAM) or a "Memristor" based storage cells.

Figure 4:
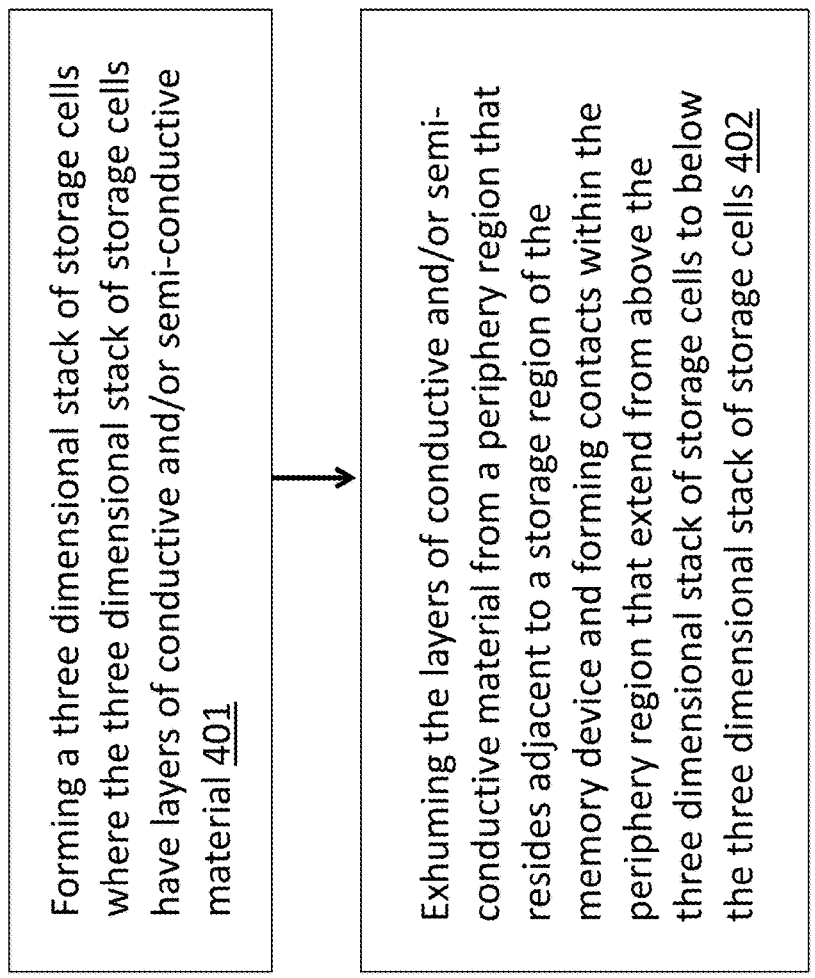
FIG. 4 shows a method for manufacturing a three dimensional memory device.

FIG. 4 shows a methodology describe above. As observed above the methodology includes forming 401 a three dimensional stack of storage cells where the three dimensional stack of storage cells have layers of conductive and/or semi-conductive material. The methodology also includes exhuming 402 the layers of conductive and/or semi-conductive material from a periphery region that resides adjacent to a storage region of the memory device and forming contacts within the periphery region that extend from above the three dimensional stack of storage cells to below the three dimensional stack of storage cells. Note that the contacts can be performed before or after the exhumation process.

FIG. 5 shows an embodiment of a computing system 500 that may include a three dimensional memory device as described above. The computing system 500 may be a personal computing system (e.g., desktop or laptop) or a mobile or handheld computing system such as a tablet device or smartphone, or, a larger computing system such as a server computing system.

As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 04, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502.

The system memory 502 may be a (e.g., byte addressable) multi-level system memory. Here, the performance of a computing system is often dependent on the performance of its system memory. As is understood in the art, program code "executes" out of system memory. If data or a portion of program code is not presently in system memory but is needed by executing code, the needed data or code is called up from storage 520 (e.g., a non volatile hard disk drive (HDD) or semiconductor storage device (SSD)). The transfer of information from storage to system memory may correspond to system inefficiency as traffic congestion within the system may increase and/or the system or a thread within the system may idle waiting for the information to be loaded in system memory.

As such computer system designers are interested in new, higher density system memory technologies such as three dimensional system memory technologies which may include a three dimensional memory device having the structures and/or manufactured according to the teachings above. With three dimensional system memory technology, the size of system memory may significantly increase as compared to traditional computer systems having two dimensional system memory technology (such as SRAM or DRAM). As such, the likelihood that a needed portion of program code or data is not present in system memory is reduced which, in turn, reduces the likelihood of enduring the inefficient transfer of information from storage to system memory.

As such, in various embodiments, the three dimensional memory described at length above may be included as, e.g., a lower level of a multi-dimensional system memory. Here, a less dense but faster system memory technology (e.g., DRAM) may be used at the upper level(s) while a more dense but slower system memory technology (e.g., three dimensional NAND FLASH or other three dimensional technology) may be used at the lower levels.

To the extent any level of system memory 502 is composed of non volatile memory (such as NAND FLASH), non traditional computing system paradigms may be entertained. For example, storage 520 may be eliminated, or, software applications (such as database applications) may run out of system memory and "commit" to system memory 502 rather than storage 520.

Referring back to computing system 500, note that the storage device 520 of the computer may also be constructed of a three dimensional memory technology such as the three dimensional memory device described at length above. The power management control unit 512 generally controls the power consumption of the system 500.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip comprising an array region and a periphery region, said array region comprising a three dimensional stack of storage cells, the three dimensional stack of storage cells formed within the interconnect wiring of the semiconductor chip, said periphery region comprising contacts extending from above the three dimensional stack of storage cells to below the three dimensional stack of storage cells, the periphery region being substantially devoid of conducting and/or semi-conducting layers of the three dimensional stack of storage cells and being part of the fully manufactured semiconductor chip, the periphery region composed of first dielectric having openings filled with second dielectric.

2. The apparatus of claim 1 wherein the three dimensional stack of storage cells further comprises a three dimensional stack of FLASH transistors.

3. The apparatus of claim 2 wherein at least one of the contacts extends from an I/O structure to a select gate source transistor layer.

4. The apparatus of claim 2 wherein at least one of the contacts extends from an I/O structure to a source line layer.

5. The apparatus of claim 2 wherein at least one of the contacts extends from an I/O structure to circuitry that resides beneath a source line layer.

6. The apparatus of claim 1 wherein at least one of the contacts extends from an I/O structure to a transistor layer.

7. The apparatus of claim 1 wherein the conducting and/or semi-conducting layers of the three dimensional stack of storage cells comprises poly-silicon.

8. The apparatus of claim 1 wherein an insulating region surrounding the contacts within the periphery region comprises air gaps.

9. The apparatus of claim 1 wherein the three dimensional stack of storage cells further comprises a first tier of stacked storage cells and a second tier of stacked storage cells.

10. A method of forming a semiconductor chip, comprising:
forming a three dimensional stack of storage cells, the three dimensional stack of storage cells comprising layers of conductive and/or semi-conductive material formed within the interconnect wiring of the semiconductor chip;
exhuming the layers of conductive and/or semi-conductive material from a periphery region that resides adjacent to a storage region of the semiconductor chip formed within the interconnect wiring of the semiconductor chip and forming contacts within the periphery region that extend from above the three dimensional stack of storage cells to below the three dimensional stack of storage cells;
completing manufacture of the semiconductor chip, the completely manufactured semiconductor chip including the periphery region being substantially devoid of conducting and/or semi-conducting layers of the three dimensional stack of storage cells.

11. The method of claim 10 wherein the contacts are formed prior to the exhuming of the layers of conductive and/or semi-conductive material.

12. The method of claim 10 wherein the contacts are formed after the exhuming of the layers of conductive and/or semi-conductive material.

13. The method of claim 10 wherein the exhuming is performed by a chemical reaction etching process.

14. The method of claim 10 further comprising substantially filling voids by performing a conformal dielectric fill process.

15. The method of claim 14 wherein the conformal dielectric fill process further comprises applying a liquid or quasi-liquid form of dielectric to a surface of the semiconductor chip and spinning the semiconductor chip.

16. A computing system, comprising:
a plurality of processing cores;
a memory controller coupled to the processing cores, a system memory coupled to the memory controller;
a non volatile storage device communicatively coupled to the memory controller, wherein at least one of the system memory and the non volatile storage device comprises a semiconductor chip comprising:
an array region and a periphery region, said array region comprising a three dimensional stack of storage cells, the three dimensional stack of storage cells formed within the interconnect wiring of the semiconductor chip, said periphery region comprising contacts extending from above the three dimensional stack of storage cells to below the three dimensional stack of storage cells, the periphery region being substantially devoid of conducting and/or semi-conducting layers of the three dimensional stack of storage cells and being part of the fully manufactured semiconductor chip, the periphery region composed of first dielectric having openings filled with second dielectric.

17. The computing system of claim 16 wherein the three dimensional stack of storage cells further comprises a three dimensional stack of FLASH transistors.

18. The computing system of claim 16 wherein the conducting and/or semi-conducting layers of the three dimensional stack of storage cells comprises poly-silicon.

19. The computing system of claim 16 wherein an insulating region surrounding the contacts within the periphery region comprises air gaps.

20. The computing system of claim 16 wherein the three dimensional stack of storage cells further comprises a first tier of stacked storage cells and a second tier of stacked storage cells.

* * * * *